(12) United States Patent
Suh

(10) Patent No.: US 6,861,872 B2
(45) Date of Patent: Mar. 1, 2005

(54) VOLTAGE DOWN CONVERTER FOR LOW VOLTAGE OPERATION

(75) Inventor: Jungwon Suh, Apex, NC (US)

(73) Assignee: Infineon Technologies AG, Munich (DE)

(*) Notice: Subject to any disclaimer, the term of this patent is extended or adjusted under 35 U.S.C. 154(b) by 87 days.

(21) Appl. No.: 10/358,581

(22) Filed: Feb. 5, 2003

(65) Prior Publication Data

US 2004/0150423 A1 Aug. 5, 2004

(51) Int. Cl.[7] .......................................... H03K 19/0175
(52) U.S. Cl. ........................... 326/62; 326/63; 326/68; 327/333
(58) Field of Search ........................... 326/62, 63, 68, 326/81, 83, 61; 327/333

(56) References Cited

U.S. PATENT DOCUMENTS 5,532,618 A * 7/1996 Hardee et al. ................. 326/63
6,617,878 B2 * 9/2003 Brownlow et al. ........... 326/68

* cited by examiner

Primary Examiner—Vibol Tan
Assistant Examiner—Joseph Lauture
(74) Attorney, Agent, or Firm—Darby & Darby

(57) ABSTRACT

A voltage down converter for a semiconductor memory device to convert an external voltage to a lower value internal voltage for the device, has a voltage generator that produces a reference voltage corresponding to the value of the internal voltage, a comparator having opposite polarity inputs for producing an amplified output control signal, and a pull-up device operating from the external voltage that receives the control signal from the comparator to produce the internal voltage as an input. A dual source follower is located between the reference voltage generator and comparator and has two sections having cross-coupled inputs which respectively receive the internal reference voltage and the internal voltage to produce output voltages moving in opposite directions, each of which is applied to one input of the comparator, thereby translating the difference between Vintref and Vint to a level in a range that can be better amplified by the comparator.

5 Claims, 5 Drawing Sheets

Voltage Down Converter For Low Voltage Operation

Voltage Down Converter For Low Voltage Operation

Voltage Down Converter For Low Voltage Operation

Voltage Down Converter For Low Voltage Operation

Voltage Down Converter For Low Voltage Operation

VOLTAGE DOWN CONVERTER FOR LOW VOLTAGE OPERATION

FIELD OF THE INVENTION

The present invention relates to a voltage down converter for semiconductor memory devices, such as synchronous DRAM, SRAM and other memory devices which operate from a very low value external voltage.

DESCRIPTION OF THE PRIOR ART

Semiconductor memory circuits are well integrated circuit devices, often called a memory chip. In general, memory circuits such as synchronous DRAM operate from a very low value external voltage as a power supply. This is particularly true for such memory devices used in mobile applications, such as hand-held and laptop computers. A voltage down converter is usually provided as an integral part of the memory device circuitry. The voltage down converter reduces the value of the power supply voltage Vext of the external source, such as a battery, to a lower voltage Vint that is used to supply voltage to the memory cells and other peripheral circuits of the device. A typical value of Vext would be 1.8 volts and for Vint would be 1.5 volts. The voltage down converter also can be used to reduce power consumption in normal operation of the memory device and reduce leakage current of the memory cells during a deep power down operation mode when the memory device is not active.

FIG. 1 shows a conventional voltage down converter circuit 1 used in semiconductor memories. All of the components of FIG. 1 are an integral part of the memory chip (integrated circuit). The circuit 1 is powered by the Vext source and has a voltage generator 10 that produces a reference voltage of level Vintref. The reference voltage generator 10 can be of any conventional construction, for example, that shown in FIG. 3 of U.S. Pat. No. 5,309,399, or other similar circuit. The generator 10 supplies the Vintref to one (−) input of a conventional differential (operational) amplifier 20 that functions as a comparator. The level of Vintref is the desired level of Vint that is to be used to operate the memory cells and peripheral circuit elements of the chip. The output of the comparator 20 is applied to the gate electrode of a pull up transistor 30. Transistor 30 is shown illustratively of the PMOS type but can be of the NMOS type if the proper polarity voltages are used.

The source electrode of the PMOS pull up transistor 30 receives the voltage Vext that is to be controlled by conduction of the transistor. The output voltage Vint that is to be supplied to the circuitry on the chip, such as an array of memory cells and peripheral circuitry, is taken off the drain electrode of transistor 30. The Vint voltage is also applied to the second (+) input of the comparator amplifier 20. Thus, as seen, the conduction of the transistor 30 is controlled by the output of the comparator 20 which amplifies the difference between the levels of the reference voltage Vintref and output voltage Vint to produce the desired voltage Vint.

Advances in memory technology is in a direction to increase the number of memory cells on a chip and to decrease the size and voltage level output of the external power supply batteries. The latter factor results in a decrease in the level of the internal voltage Vint available for the device internal circuitry, including the memory cells.

In prior art circuits, in the case where the reference voltage Vintref is close to the external voltage Vext, the comparator 20 operates in the operation region that has very low sensitivity. That is, the comparator 20 cannot amplify the voltage difference between inputs, and its voltage regulation fails. This is shown in FIG. 1A which is a DC analysis where the vertical axis is the output voltage of the comparator and the horizontal axis the voltage Vint. In the analysis, Vext=1.65V and Vintref is varying from 0.65V and 1.55V (0.1V steps). As seen, when Vintref>1.3V, the comparator output experiences a malfunction. When Vint is larger than Vintref, the comparator output should be a voltage level near Vext to cut off pull up transistor (30). If not, the pull up device could not be controlled by the comparator and the voltage down converter cannot regulate Vint which is equal to Vintref. The failure is due to too low a voltage gain of the comparator when the target Vint voltage (=Vintref) is close to Vext. If the input voltages to the comparator are moved to lower voltage, in this example<1.3V, the comparator can operate well. But it means another voltage level translator is needed between the inputs (Vintref and Vint) and the comparator.

Therefore, the circuit of FIG. 1 has a limitation in the case where it has to regulate a value of Vint that is close to the external voltage Vext level, such as low voltage applications require.

BRIEF DESCRIPTIONS OF THE INVENTION

The present invention is directed to a novel voltage down converter for a memory chip that provides a more stable operation in situations where the value of the external voltage Vext is low. In accordance with the invention, a voltage down converter is provided in which there is a dual source follower between the reference voltage generator and the (operational amplifier) comparator. The dual source follower has two sections whose inputs are cross-coupled so that the sections conduct in opposite directions. The reference voltage generator supplies the reference voltage Vintref to one input of each of the two follower sections and the output voltage Vint of the pull up transistor is applied to the other input of each follower section. Each follower section produces an output voltage that is the difference between the input voltages Vintref and Vint but the outputs of the two sections are in opposite directions.

The oppositely moving output of each of the follower sections is applied to one of the positive (+) and negative (−) inputs of the comparator. The comparator, whose output controls the pull up transistor, can have a high gain. Thus, since each of the two output voltages of oppositely moving polarity of the dual source follower is applied to one of the + and −inputs of the (operational amplifier) comparator, the comparator amplifies a signal of value that is larger than only the difference between Vintref and Vint.

Accordingly, the present invention solves the problem by the dual source follower shifting the input voltage difference between Vintref and Vint to another voltage difference which can be more easily amplified by the comparator. In accordance with the invention, the voltage gain of the dual source follower is greater than 1.0 and the comparator 20 can amplify the shifted voltage difference with high sensitivity.

BRIEF DESCRIPTION OF THE DRAWINGS

Other objects and advantages of the present invention will become more apparent upon reference to the following specification and annexed drawings in which.

DETAILED DESCRIPTION OF THE INVENTION

Figure 1:
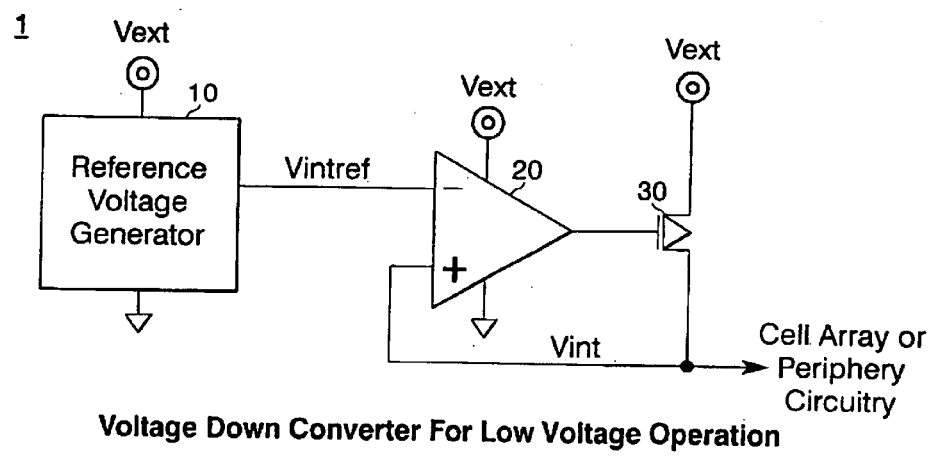
FIG. 1 is a diagram of a conventional voltage down converter.
Figure 1A:
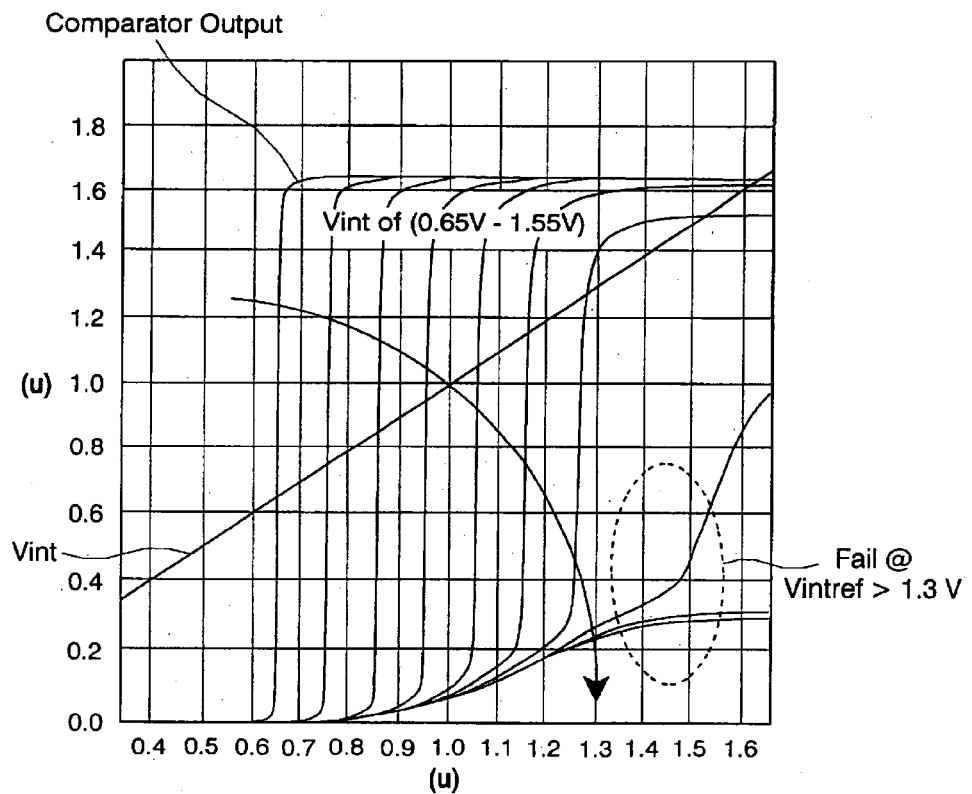
FIG. 1A is a diagram of the operation of the voltage down converter of FIG. 1.
Figure 2:
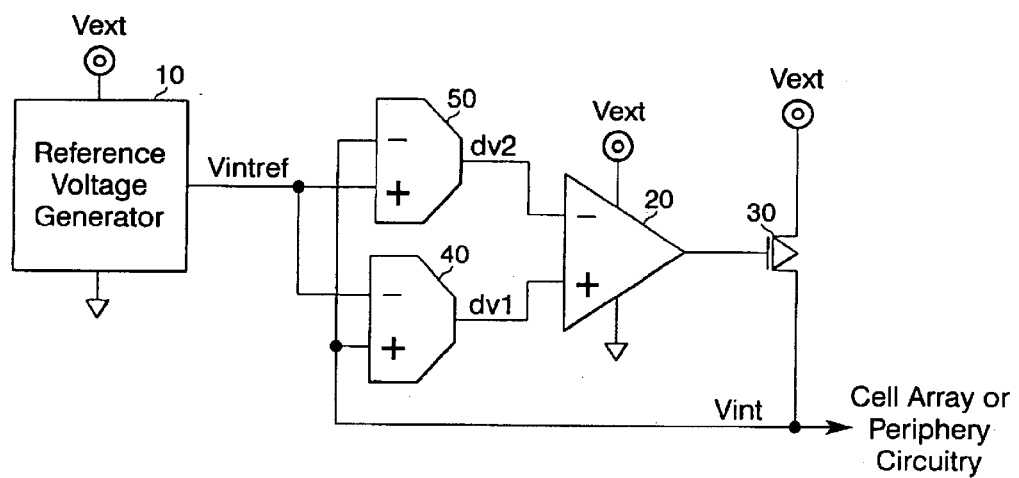
FIG. 2 is a diagram of the voltage down converter of the invention.

Referring to FIG. 2, the voltage down converter of the invention has on the memory chip the reference voltage generator 10, comparator 20 and PMOS transistor pull up driver 30, as previously described. Here, the output Vintref of the reference voltage generator 10 is applied to the opposite polarity inputs of two source voltage followers 40 and 50. The source followers 40 and 50 have the same construction and are described in detail below. That is, the Vintref voltage is applied to negative (−) input of source follower 40 and to the positive (+) input of source follower 50. The output voltage Vint from the pull up transistor 30 is applied to the (+) input of the source follower 40 and the (−) input of follower 50. The Vint output of the transistor 30 is also supplied to the other circuitry on the chip. Source follower 40 produces a voltage dv1 that is applied to the positive (+) input of comparator 20, while source follower produces a voltage dv2 moving in a direction opposite to that of dv1 that is applied to the other (−) input of the comparator 20. The amplified output of the comparator is applied to the gate electrode of the pull up transistor 30 to control its output voltage Vint.

Figure 2A:
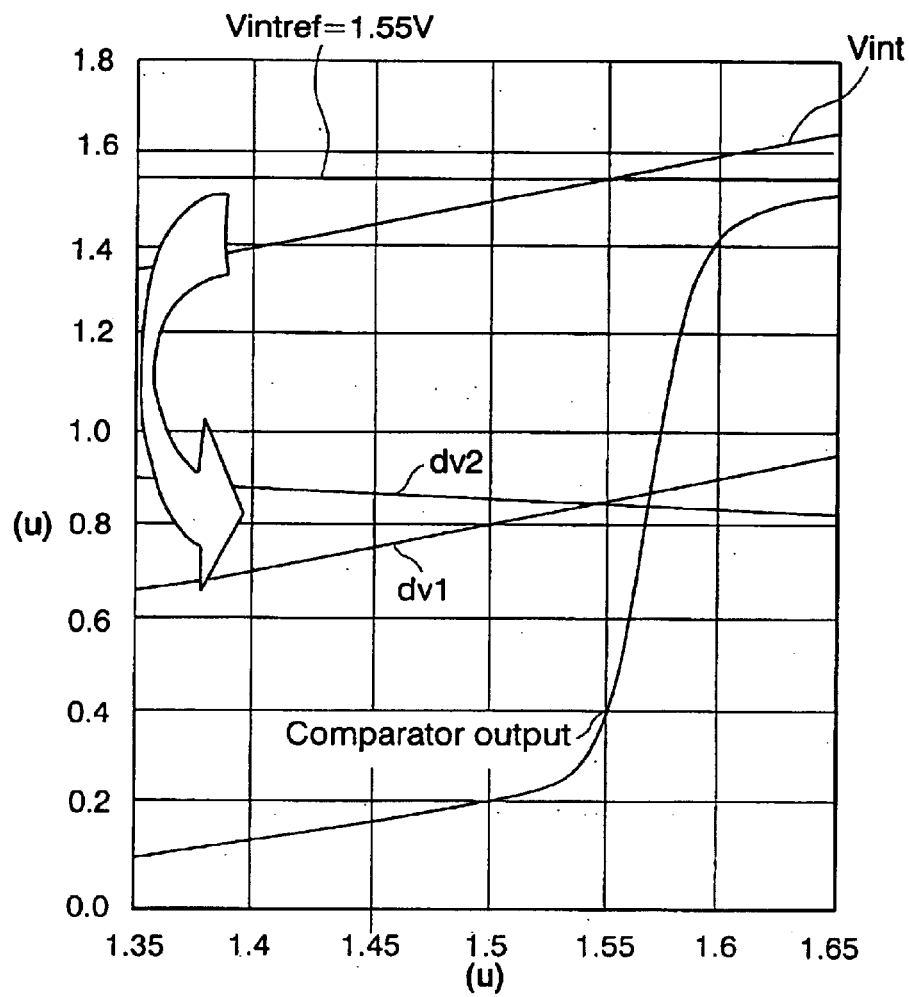
FIG. 2A is a diagram illustrating the operation of the circuit of FIG. 2.

As seen, the source followers 40 and 50 have cross-coupled inputs, Vintref and Vint. Even though the level of the reference voltage Vintref is close to that of the external voltage Vext, the comparator 20 operates in an operation region that has high sensitivity. This is shown in FIG. 2A which illustratively shows an example in which Vintref= 1.55V and Vext=1.65V. The dual source follower translates the voltage difference between Vint and Vintref to dv1 and dv2 and the voltage difference between dv1 and dv2 is the same or larger than the voltage difference between Vint and Vintref. This means that the dual source follower has a voltage gain of >1.0. As seen in FIG. 2A, even though the target Vint level (=Vintref) is very close to Vext, the input voltages to the comparator (dv1 and dv2) are translated to near the middle (0.8V) of the operation range of the comparator by the dual source follower. That means that the comparator can amplify the input voltage difference with high voltage gain.

Figure 3:
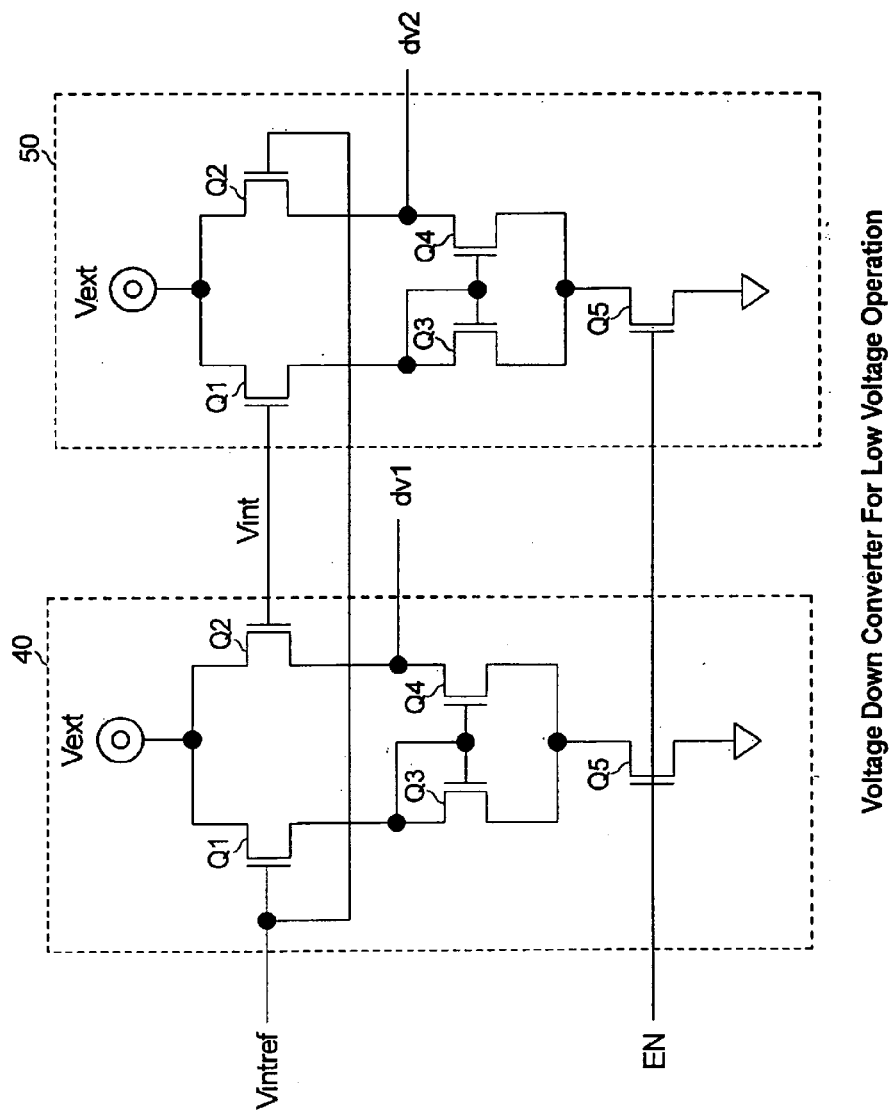
FIG. 3 is a schematic diagram of the dual source follower circuits in accordance with the present invention.

FIG. 3 shows a preferred embodiment Of the dual source follower circuits 40 and 50. Referring to the source follower 40, there are a plurality of NMOS transistors with Q1 and Q2 being the inputs and having their drain electrodes connected to the operating voltage source Vext or other suitable source. The gate electrodes of Q1 and Q2 respectively receive the voltages Vintref and Vint.

The drain electrode of a transistor Q3 serves as a current mirror and is connected to the source electrode of transistor Q1. The drain electrode of a current mirror transistor Q4 is connected to the source electrode of transistor 02. The gate electrodes of the current mirror transistors Q3 and Q4 are connected together and to the source electrode of transistor Q1. The source electrodes of the current mirror transistors 03 and Q4 are connected to the drain electrode of a switching transistor Q5 whose source electrode is connected to ground.

The gate electrode of the switching transistor Q5 receives an enabling signal EN from a circuit on the memory chip or from an external source that controls when the voltage down converter is to operate. That is, the enabling signal EN makes the transistor Q5 conduct and complete the follower circuit ground. The voltage down converter is not operated, for example, when the memory device is in a power down mode. As the voltages Vintref and Vint are applied to the input transistors Q1 and Q2 they conduct accordingly through the current mirror transistors Q3 and Q4 and the switching transistor Q5. The output of follower 40 is the dv1 voltage that appears at the source electrode of transistor Q2. The voltage dv1 basically corresponds to the difference between Vintref and Vint.

The follower 50 is of similar construction to follower 40, but reversed in operation. That is, the input transistor 01 receives the voltage Vint and the input transistor 02 receives the voltage Vintref. The follower output dv2 is produced at the source electrode of transistor 02. The output voltage dv2 moves in the opposite direction to that of dv1. In the operation of the dual follower 40 and 50, if the level of Vint goes below that of Vintref, the output dv1 of follower 40 is lower than dv2 of follower 50. Conversely, if the level of Vint goes above that of Vintref, the dv1 has higher voltage level than dv2.

Specific features of the invention are shown in one or more of the drawings for convenience only, as each feature may be combined with other features in accordance with the invention. Alternative embodiments will be recognized by those skilled in the art and are intended to be included within the scope of the claims.

I claim:

1. A voltage down converter for a semiconductor memory device to convert an external voltage to a lower value internal voltage for the device, comprising:

a voltage generator for producing a reference voltage corresponding to the value of the internal voltage;

a comparator having opposite polarity inputs for producing an output control signal;

a pull up device operating from the external voltage and receiving the control signal from said comparator to produce the internal voltage as an output; and a source follower between said reference voltage generator and said comparator, said source follower having two sections having cross-coupled inputs each of which inputs respectively receives the internal reference voltage and the internal voltage, the voltage outputs of said two sections moving in opposite directions and the voltage output of each section applied as an input to one of the two inputs of said comparator;

wherein each section of said source follower includes first and second transistors, said reference voltage signal applied to one of said first and second transistors and said internal voltage applied to the other of said first and second transistor, a third transistor connected to said first transistor as a current mirror and a fourth transistor connected to said second transistor as a current mirror, the output voltage of the section appearing at the juncture of said second and fourth transistors.

2. A voltage down converter as claimed in claim 1, further comprising a fifth transistor between said second and fourth transistors and ground and responsive to an enabling signal to enable said first, second, third and fourth transistors into operation.

3. A voltage down converter as claimed in claim 1 wherein each of said first, second, third and fourth transistors is an NMOS transistor, the gate electrode of one of said first and third transistors receiving the internal voltage and the gate electrode of the other of said first and third transistors receiving the reference voltage, the drain electrodes of said first and third transistors connected to the external voltage, the source electrode of said first and third electrodes connected to the drain electrodes of said second and fourth transistors, the gate electrodes of said second and fourth transistors connected together and the output voltage taken at the connection of the drain of said second transistor and source of said first transistor.

4. A voltage down converter as set forth in claim 3 further comprising a fifth NMOS transistor having a drain electrode connected to the source electrode of each of said second and fourth transistors, a source electrode connected to ground, and a gate electrode receiving an enabling signal to make the fifth transistor conduct and complete the circuit of each said source follower between the external voltage and ground.

5. A voltage down converter as claimed in claim 3 wherein said pull up device is a transistor of the PMOS type.

* * * * *